(12) United States Patent
Park et al.

(10) Patent No.: US 6,658,612 B1
(45) Date of Patent: Dec. 2, 2003

(54) TEST SIGNAL GENERATING CIRCUIT OF A SEMICONDUCTOR DEVICE WITH PINS RECEIVING SIGNALS OF MULTIPLE VOLTAGE LEVELS AND METHOD FOR INVOKING TEST MODES

(75) Inventors: Cheol-Hong Park, Seoul (KR); Sang-Seok Kang, Suwon (KR); Jong-Hyun Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/550,944

(22) Filed: Apr. 17, 2000

(30) Foreign Application Priority Data

Apr. 17, 1999 (KR) .............................................. 99-13715

(51) Int. Cl.[7] ............................................. G01R 31/28
(52) U.S. Cl. ....................................... 714/724; 324/765
(58) Field of Search ................................ 714/724, 721, 714/718, 738, 745, 733; 365/201, 195, 189.02–189.11, 233; 324/765, 763; 326/16, 35, 37–40, 21, 50; 327/143, 404, 391; 257/48, 350

(56) References Cited

U.S. PATENT DOCUMENTS 4,837,505 A * 6/1989 Mitsunobu .................. 324/763
5,036,272 A    7/1991 Cho et al. ................... 158/324
5,420,869 A * 5/1995 Hatakeyama ............... 714/718
5,528,162 A * 6/1996 Sato .......................... 324/765
5,629,944 A * 5/1997 Kagami ..................... 714/721

* cited by examiner

Primary Examiner—Emmanuel L. Moise
Assistant Examiner—Guy Lamarre
(74) Attorney, Agent, or Firm—Marger Johnson & McCollom, P.C.

(57) ABSTRACT

A signal generating circuit of a semiconductor device comprises n input test pins for receiving respective coded input signals. At least one of the input signals is coded in more than two possible levels, such as 3 levels or four levels. The device also includes an indicator I/O signal generators, each coupled respectively with an associated input test pin. Each indicator signal generator generates two-level indicator signals in response to the coded input signal received by its associated input test pin. A decoder receives the indicator signals to produce decoded signals, and a mode selecting circuit generates mode selecting signals with the decoded signals responsive to mode setting signals. Each indicator signal generators outputs a regular signal when the input test signal is an ordinary low, a control signal when the input test signal is an ordinary high, and a higher first level signal when the input test signal is a super high. If more than three levels are used, the indicator signal generator further generates corresponding signals for these higher values.

14 Claims, 10 Drawing Sheets

FIG. 7

| A2 | A3 | PA2B | PA2 | SA1 | PA3B | PA3 | SA2 | PA2B | PPA2 | SA1 | PA3B | PPA3 | SA2 | d1 | d2 | d3 | d4 | d5 | d6 | d7 | d8 | d9 |
|---|---|---|---|---|---|---|---|---|---|---|---|---|---|---|---|---|---|---|---|---|---|---|
| L | L | H | L | L | H | L | L | H | L | L | H | L | L | H | L | L | L | L | L | L | L | L |
| L | H | H | L | L | L | H | L | H | L | L | L | H | L | L | H | L | L | L | L | L | L | L |
| L | SH | H | L | L | L | H | H | H | L | L | L | L | H | L | L | H | L | L | L | L | L | L |
| H | L | L | H | L | H | L | L | L | H | L | H | L | L | L | L | L | H | L | L | L | L | L |
| H | H | L | H | L | L | H | L | L | H | L | L | H | L | L | L | L | L | H | L | L | L | L |
| H | SH | L | H | L | L | H | H | L | H | L | L | L | H | L | L | L | L | L | H | L | L | L |
| SH | L | L | H | H | H | L | L | L | H | H | L | L | L | L | L | L | L | L | L | H | L | L |
| SH | H | L | H | H | L | H | L | L | L | H | L | H | L | L | L | L | L | L | L | L | H | L |
| SH | SH | L | H | H | L | H | H | L | L | H | L | L | H | L | L | L | L | L | L | L | L | H |

FIG. 11

| A2 | A3 | PA2B | PA2 | SA1 | SB1 | PA3B | PA3 | SA2 | SB2 | PA2B | PPA2 | PSA1 | SB1 | PA3B | PPA3 | PSA2 | SB2 | d1 | d2 | d3 | d4 | d5 | d6 | d7 | d8 | d9 | d10 | d11 | d12 | d13 | d14 | d15 | d16 |
|---|---|---|---|---|---|---|---|---|---|---|---|---|---|---|---|---|---|---|---|---|---|---|---|---|---|---|---|---|---|---|---|---|---|
| L | L | H | L | L | L | H | L | L | L | H | L | L | L | H | L | L | L | H | L | L | L | L | L | L | L | L | L | L | L | L | L | L | L |
| L | H | H | L | L | L | L | H | L | L | H | L | L | L | L | H | L | L | L | H | L | L | L | L | L | L | L | L | L | L | L | L | L | L |
| L | SH1 | H | L | L | L | L | H | H | L | H | L | L | L | L | L | H | L | L | L | H | L | L | L | H | L | L | L | L | L | L | L | L | L |
| L | SH2 | H | L | L | L | H | H | H | L | L | L | L | L | L | H | L | L | H | L | L | L | L | L | L | L | L | L | L | L | L | L | L | L |
| H | L | L | H | L | L | H | L | L | L | H | L | L | H | L | L | L | L | L | L | H | L | L | L | L | L | L | L | L | L | L | L | L | L |
| H | H | L | H | L | L | L | H | L | L | H | L | L | H | L | L | L | L | L | H | L | L | L | L | L | L | L | L | L | L | L | L | L | L |
| H | SH1 | L | H | L | L | H | H | H | L | H | L | L | L | L | L | H | L | L | L | L | L | L | H | L | L | L | L | L | L | L | L | L | L |
| H | SH2 | L | H | L | L | H | H | H | L | H | L | L | L | L | L | H | L | L | L | L | L | H | L | L | L | L | L | L | L | L | L | L | L |
| SH1 | L | L | H | H | L | H | L | L | L | L | H | L | H | L | L | L | L | L | L | L | L | L | H | L | L | L | L | L | L | L | L | L | L |
| SH1 | H | L | H | H | L | L | H | L | L | L | L | H | L | H | L | L | L | L | L | L | L | L | L | H | L | L | L | L | L | L | L | L | L |
| SH1 | SH1 | L | H | H | L | L | H | H | L | L | L | H | L | L | H | L | L | L | L | L | L | L | L | L | H | L | L | L | L | L | L | L | L |
| SH1 | SH2 | L | H | H | L | H | H | H | L | L | L | H | L | L | H | L | L | L | L | L | L | L | L | L | L | H | L | L | L | L | L | L | L |
| SH2 | L | L | H | H | H | H | L | L | L | L | L | L | H | H | L | L | L | L | L | L | L | L | L | L | L | L | H | L | L | L | L | L | L |
| SH2 | H | L | H | H | H | L | H | L | L | L | L | L | H | L | H | L | L | L | L | L | L | L | L | L | L | L | L | H | L | L | L | L | L |
| SH2 | SH1 | L | H | H | H | L | H | H | L | L | L | L | H | L | L | H | L | L | L | L | L | L | L | L | L | L | L | L | H | L | L | L | L |
| SH2 | SH2 | L | H | H | H | H | H | H | L | L | L | L | H | L | L | H | L | L | L | L | L | L | L | L | L | L | L | L | L | L | L | L | H |

TEST SIGNAL GENERATING CIRCUIT OF A SEMICONDUCTOR DEVICE WITH PINS RECEIVING SIGNALS OF MULTIPLE VOLTAGE LEVELS AND METHOD FOR INVOKING TEST MODES

BACKGROUND OF THE INVENTION

Field of the Invention

The present invention relates to a semiconductor device, and more particularly to a signal generating circuit of the semiconductor device which generates a number of test mode selecting signals for performing a test during an operational mode, and further generates signals at a normal operational mode.

Description of Prior Art

In general, operations of semiconductor devices can be classified into normal and test modes. Test modes are subdivided into a plurality of test items, for which respective tests are performed to determine whether a product is good or defective.

In order to get the semiconductor device ready to test each test item, it is necessary to have test mode selecting signals generated internally within the semiconductor device to set up the test mode. For this purpose, a test mode selecting circuit is constructed with a predetermined number of pins among address or data pins of the semiconductor device, which are used as test mode selecting pins for buffering and decoding signals transmitted to the pins, to thereby generate test mode selecting signals for testing a plurality of test items.

The conventional test mode selecting circuit of the semiconductor device can only generate $n^2$ test mode selecting signals, where, n denotes the number of pins. For example, if the number of test items to test at the test operational mode is 8, 3 test mode selecting pins are required. If more test items are required, more test mode selecting pins should be allocated.

The same is also true for internally generated signals at the normal operational mode. Their maximum number is 2, where n denotes the number of pins. Therefore, if internally generated signals are required, more pins are also required for the operation.

In other words, in semiconductor devices the number of pins allocated for testing should increase when the number of signals to be internally generated increases, whether at test or normal operational modes. This is a problem, because semiconductor devices have the tendency of increasing integration, which decreases the size of the chip. Any increase in the number of pins limits the efforts to reduce the size of the chip.

FIG. 1 is a block diagram for illustrating a conventional test mode selecting circuit of a semiconductor device, which has been already disclosed in U.S. Pat. No. 5,036,272, which is hereby incorporated by reference.

There are input pins 10, 14-1, 14-2, 14-3, 14-4, buffers 12, 16-1, 16-2, 16-3, 16-4, a high voltage sensing circuit 18, decoders 20, 22 and a mode selecting circuit 24 at the block diagram in FIG. 1. As can be seen, a predetermined number of pins of the semiconductor device used for normal operations at the normal operational mode are used as pins for generating test mode selecting signals at the test operational mode.

Since there are only four input pins 14-1, 14-2, 14-3, 14-4, the conventional test mode selecting signal generating circuit shown in FIG. 1 can only generate up to 16 test mode selecting signals. This, in turn, limits the number of test items.

As more test items are required, more pins in the circuit are required. Therefore, there still remains a problem in the conventional test mode selecting signal generating circuit, in that the increase in the number of pins to be used at the test operational mode can not be restricted, in spite of reduction in the size of a chip.

SUMMARY OF THE INVENTION

The present invention recognizes that the prior art was so limited because it only allowed each test input pin to receive a signal of only two possible values (high and low). The present invention provides a device and a method that allows more values for each of the input pins, and therefore permits more test modes without requiring more pins.

The present invention therefore provides a signal generating circuit of a semiconductor device, and a method for invoking test modes in the semiconductor device.

The signal generating circuit of the device of the invention includes n input test pins for receiving respective coded input signals. At least one of the input signals is coded in more than two possible levels, such as 3 levels or four levels.

The device further includes an indicator signal generators, each coupled respectively with an associated input test pin. Each indicator signal generator generates indicator signals in response to the coded input signal received by its associated input test pin. The indicator signals are of only two levels.

A decoder receives the indicator signals to produce decoded signals, and a mode selecting circuit generates mode selecting signals with the decoded signals responsive to mode setting signals.

The indicator signal generators preferably include a buffer outputting a regular signal, indicative of whether the associated input signal has an ordinary low level, a first higher level voltage detector for outputting a higher first level signal indicative of whether the associated input signal has a first extra high level higher than the ordinary low level, and a scrambling circuit for producing, in response to the regular signal and to the higher first level signal, a control signal indicative of whether the associated input signal has an ordinary high level higher than the ordinary low level and lower than the first extra high level.

If more than three levels are used, the indicator signal generators further include a second higher level voltage detector for outputting a higher second level signal indicative of whether the associated input signal has a second extra high level higher than the first extra high level.

The method of the invention is for invoking a test mode in a circuit of a semiconductor device. The method includes applying coded input signals to input test terminals of the circuit, where at least one of the input signals has more than two possible levels, then generating two-level indicator signals in response to the coded input signals, and decoding the indicator signals to generate decoded signals.

These and other features and advantages of the present invention will be understood from the Detailed Description and the drawings.

BRIEF DESCRIPTION OF THE DRAWINGS

FIG. 7 is a truth table of a circuit shown in FIG. 4;

FIG. 11 is a truth table of a circuit shown in FIG. 10; and

DETAILED DESCRIPTION OF THE INVENTION

A signal generating circuit of a semiconductor device of the present invention will be described with reference to accompanying drawings.

Figure 1:
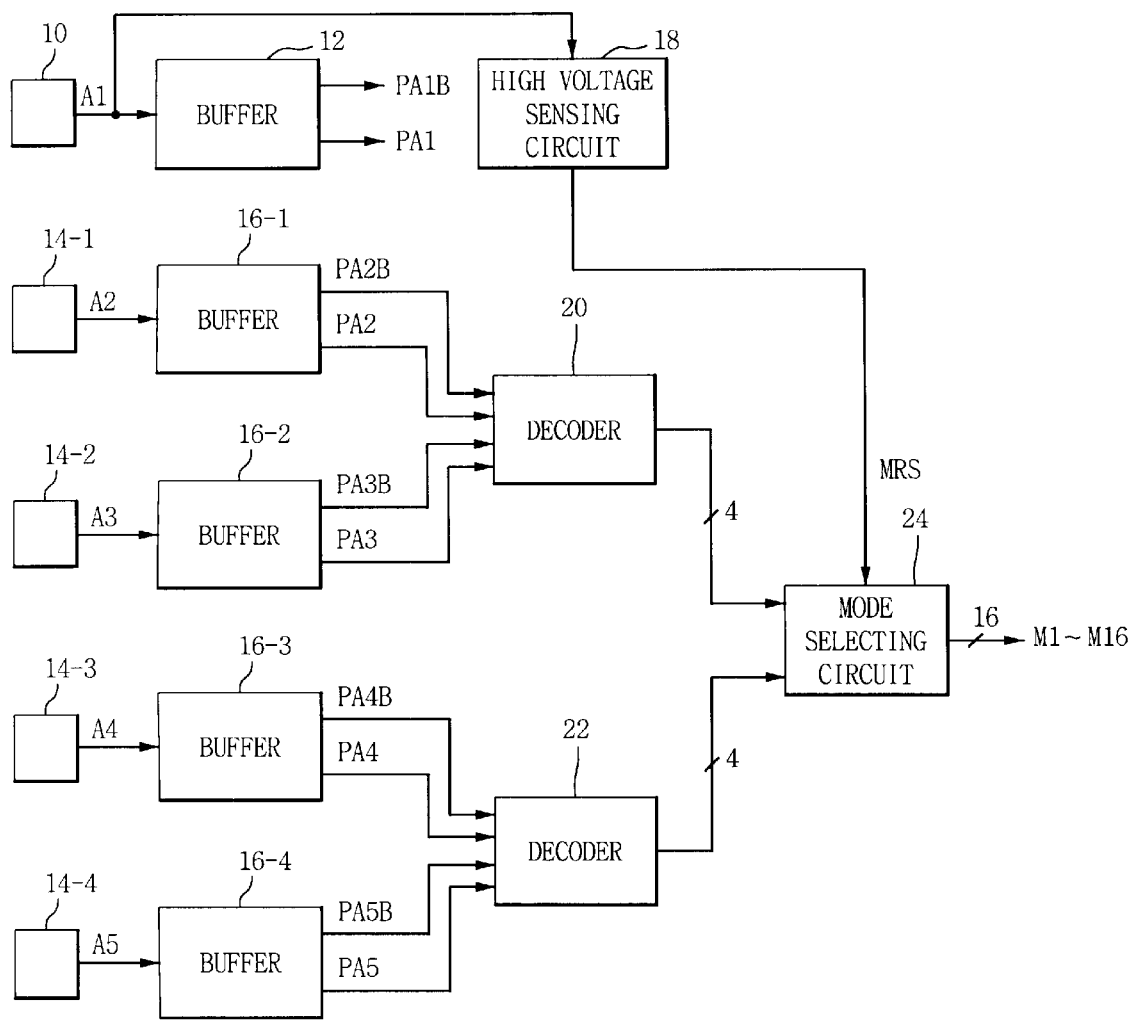
FIG. 1 is a block diagram for illustrating a mode selecting signal generating circuit of a conventional semiconductor device.
Figure 2:
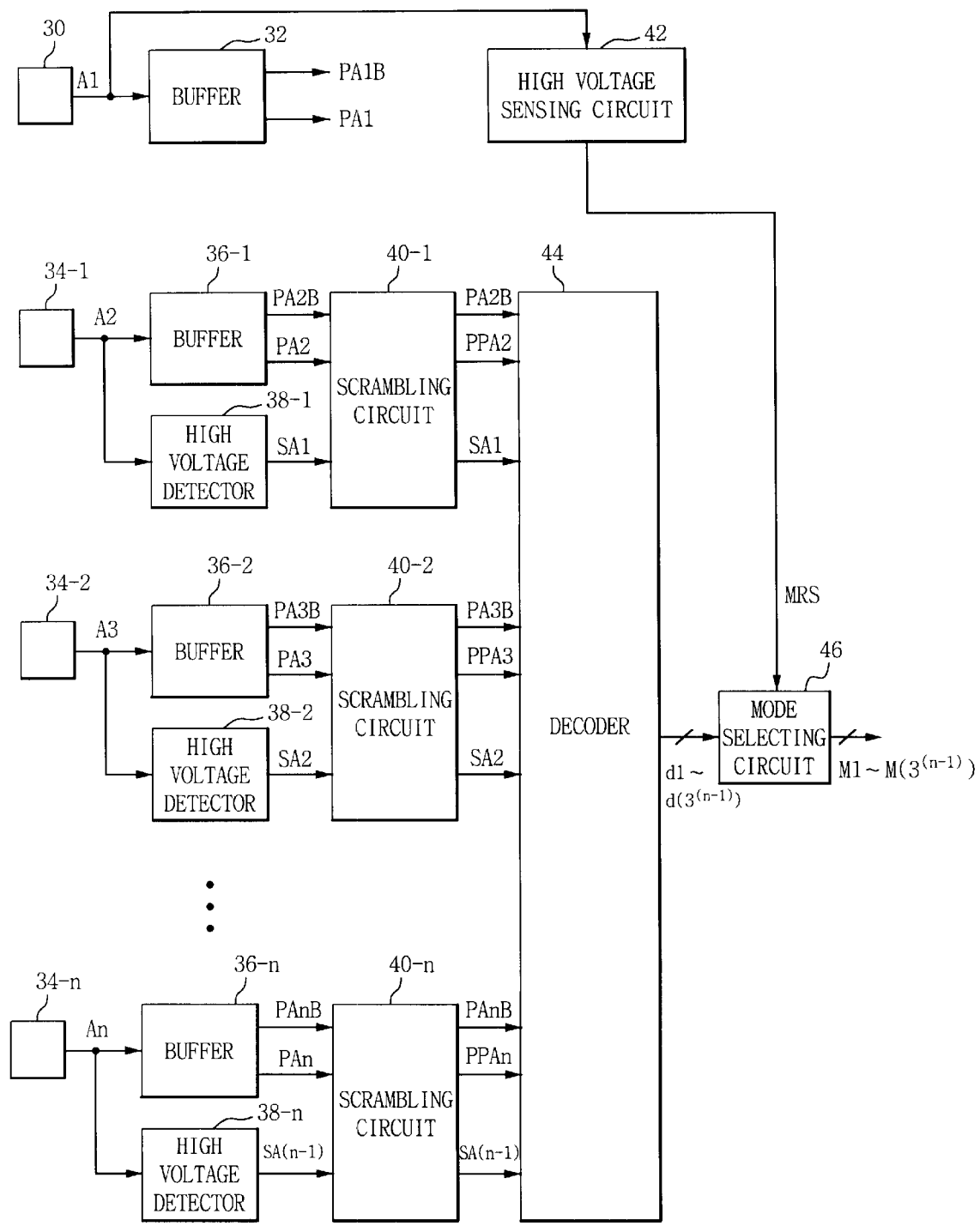
FIG. 2 is a block diagram for illustrating a signal generating circuit of a semiconductor device in accordance with an embodiment of the present invention, wherein each input test pin can receive three input values.

FIG. 2 is a block diagram for illustrating the signal generating circuit of the semiconductor device in accordance with an embodiment of the present invention. The circuit includes input pins 30, 34-1, . . . , 34-n, buffers 36-1, . . . , 36-n, high voltage detectors 38-1, 38-2, . . . , 38-n, scrambling circuits 40-1, 40-2, . . . , 40-n, a high voltage sensing circuit 42, a decoder 44 and a mode selecting circuit 46.

In FIG. 2, the input pin 30 is used as a pin for transmitting a signal to select test or normal operational mode. Input test pins 34-1, 34-2, . . . , 34-n are also called input pins, and generally receive an input signal. The input pins are used as pins for transmitting selecting signals to select test items that are to be tested at the test operational mode.

Buffers 32, 36-1, 36-2, . . . , 36-n in general output a regular signal indicative of whether the input signal has one of an ordinary low level or not. In particular, they respectively buffer input signals Ai (i=1, 2, . . . , n), to respectively generate complementary levels of two signals PAiB, PAi (i=1, 2, . . . , n).

The high voltage detectors 38-1, 38-2, . . . , 38-n in general output a higher first level signal SAI indicative of whether the input signal has a first extra high voltage higher than an ordinary high level. In particular, they generate signals SAi (i=1, 2, . . . , n). These correspond to additional possible signal values, namely voltages higher than "high".

In addition, the scrambling circuits 40-1, 40-2, . . . , 40-n produce control signals in response to the regular signals and any higher level signals. In particular, they respectively scramble input signals PAiB, PAi, SAi (i=1, 2, . . . , n) to generate control signals PAIB, PPAi, SAj (i=2, . . . , n, j =1, 2, . . . , n-I). The control signals indicate whether the input signal has an ordinary high level, between the ordinary low and the first extra high.

Collectively, the regular signal, control signals, and the higher level signals are called indicator signals. They are used to decode, in two levels, the levels of the multi-level coded signals that are applied to the test pins.

The high voltage sensing circuit 42 senses high voltage inputted from the input pin 30, and generates a signal MRS. Signal MRS is high at the test operational mode, and low at the normal operational mode.

The decoder 44 decodes the output signals generated from the scrambling circuits 401, 40-2, . . . , 40-n, to generate mode selecting signals. The mode selecting circuit 46 responds to the MRS signal being high, to select and latch the mode selecting signals generated from the decoder 44. The selecting signals generated as such make the internal state of the semiconductor device set up for testing specifically designated test items at the test operational mode.

In the signal generating circuit of the semiconductor device shown in FIG. 2, signals of three levels are inputted from the tester to at least one of the test pins, at the test operational mode, and signals of two or three levels are inputted from an external system out of the semiconductor device. It is preferred that signals of three levels are transmitted to all test pins.

Figure 3:
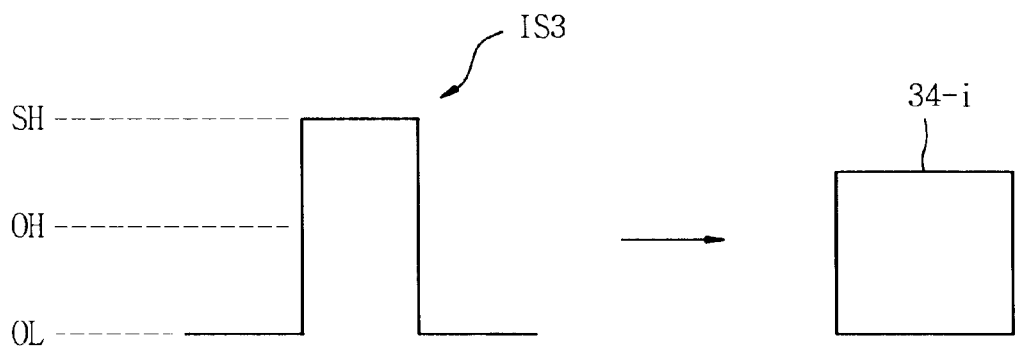
FIG. 3 is a diagram showing a signal of 3 possible levels being applied to an input test terminal of the device of FIG. 3.

The various levels are now explained in more detail with reference to FIG. 3. At least one of the input test pins 34-i receives an input signal IS3. Generally, signal IS3 has one of 3 preselected levels, namely an ordinary low (OL), an ordinary high (OH), and a first extra high or super high (SH) level. Other names are also applicable to such values. In this case, the signal IS3 has the SH value.

These levels can be selected in any advantageous way. One such way is to select the OL level to be 0V, the OH level to be the high level ordinarily used within the circuit, and the SH level to be even higher. That is not necessary, however. The CMOS technology is preferred, because it offers a large range of operating voltages from which to chose the levels. In other words, signals of low, high or high voltage levels can be inputted at the test operational mode, and signals of low or high level, or low, high or high voltage level should be inputted at the normal operational mode. If signals of three levels are inputted to address input pins at the normal operational mode, the number of address input pins can be reduced. This, however, would require other circuits to cooperate also in a non-test environment.

Figure 4:
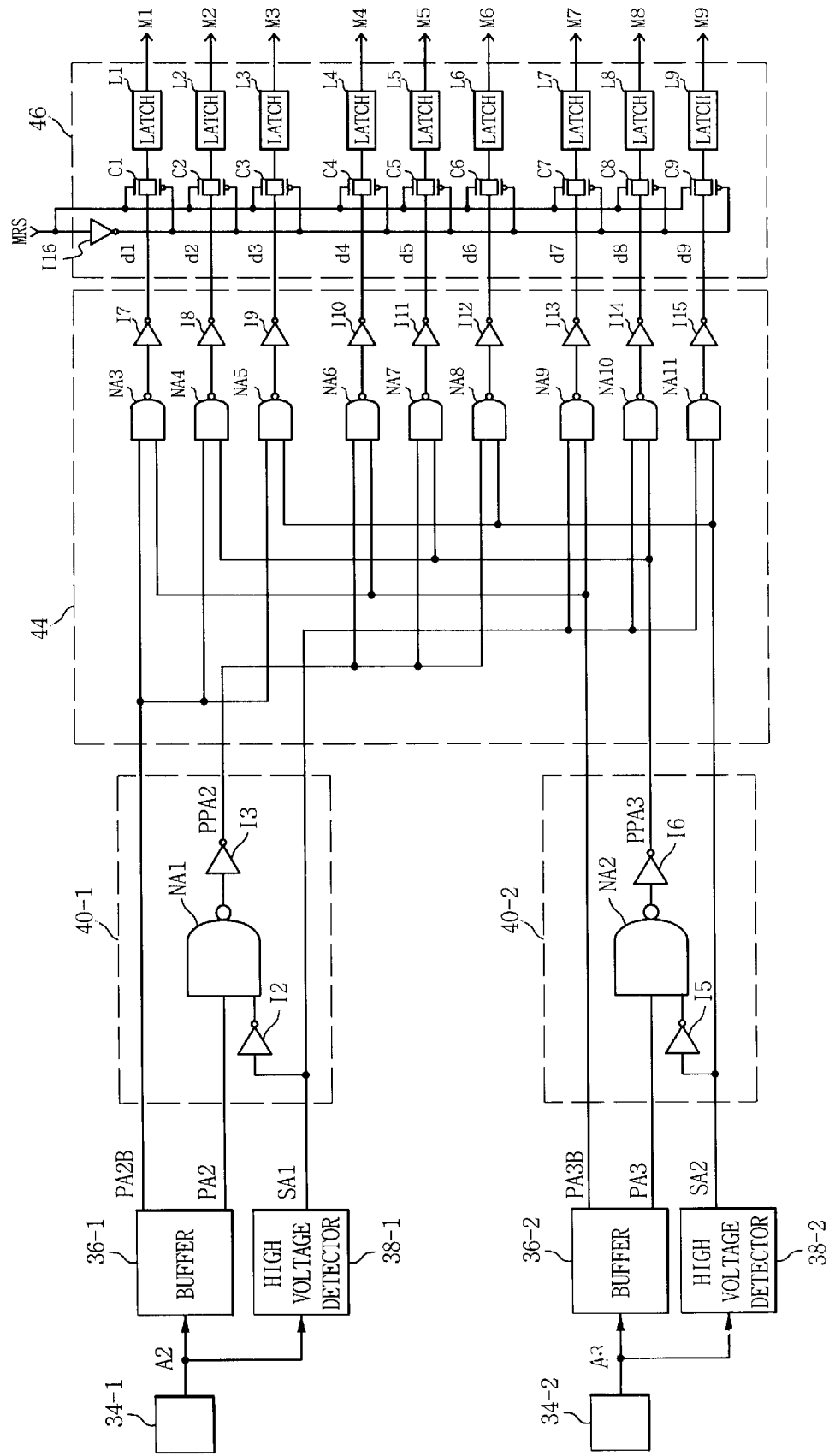
FIG. 4 is a circuit diagram for implementing a portion of the block diagram shown in FIG. 2.

FIG. 4 is a circuit diagram for illustrating the structure of an embodiment of the block diagram shown in FIG. 2, wherein input signals of three levels are transmitted to two input pins, to generate 9 mode selecting signals M1, M2, . . . , M9.

The scrambling circuit 40-1 is constructed with inverters I1, I2, I3 and a NAND gate 10 NA1, and the scrambling circuit 4-2 is constructed with inverters 14, 15, 16 and a NAND gate NA2.

Additionally, the decoder 44 is constructed with NAND gates NA3, NA4, . . . , NA11 and inverters 17, 18, . . . , I15.

The mode selecting circuit 46 is constructed with CMOS transmission gates C1, C2, is . . . , C9, an inverter I16 and latches L1, L2, . . . , L9.

The functions of respective parts in the circuit thus constructed and shown in FIG. 4 will be described below.

Buffers 36-1, 36-2 respectively buffer the signals inputted from the input pins 34-1, 34-2 to generate complementary output signals (PA2B, PA2), (PA3B, PA3). The high 20 voltage detectors 38-1, 38-2 respectively detect and buffer the high voltage inputted from the input pins 34-1, 34-2 to generate high level of signals SA1, SA2.

The scrambling circuit 40-1 outputs signals PA2B, SA1 as they are, inverts signals PA2B, SA1 through the inverters 11, 12 and ANDs the output signals of the inverters 11, 12 and the signal PA2 through the NAND gate NAI and an inverter 13 to generate a signal PPA2. Similarly, the scrambling circuit 40-2 outputs the signals PA3B, SA2 as they are, and generates a signal PPA3.

The decoder 44 ANDs the signals PA2B, PA3B through a NAND gate NA3 and an inverter 17 to generate a signal d1, ANDs the signals PA2B, PPA3 through a NAND gate NA4 and an inverter 18 to generate a signal d2, ANDs the signals PA2B, SA2 through a 30 NAND gate NA5 and an inverter 19 to generate a signal d3, ANDs the signals PPA2, PA3B through a NAND gate NA6 and an inverter 110 to generate a signal d4, ANDs the signals PPA2, PPA3 through a NAND gate NA7 and an inverter 111 to generate a signal d5, ANDs the signals PPA2, SA2 through a NAND gate NA8 and an inverter 112 to generate a signal d6, ANDs the signals SA1, PA3B through a NAND gate NA9 and an inverter 113 to generate a signal d7, ANDs the signals SA1 PPA3 through a NAND gate NA1 and an inverter 114 to generate a signal d8 and ANDs the signals SA1, SA2 through a NAND gate NA11 and an inverter 15 to generate a signal d9.

The mode selecting circuit 46 responds to a high level of a mode setting signal MRS to respectively trait output signals d1, d2, . . . , d9 outputted from the decoder 44 through CMOS transmission gates C1, C2, . . . , C9. The latches L1 L2, . . . , L9 respectively latch the output signals of the CMOS transmission gates C1, C2, . . . , C9 to output mode selecting signals M1, M2, . . . , M9.

Figure 5:
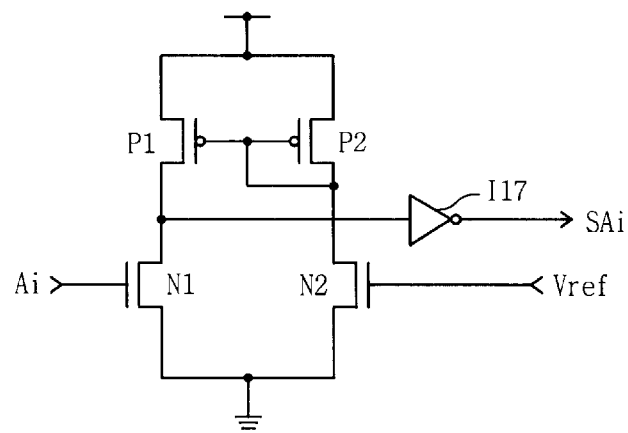
FIG. 5 is a circuit diagram for illustrating a high voltage detector in accordance with an embodiment of the present invention.

FIG. 5 is a circuit diagram of the high voltage detector in accordance with an embodiment of the present invention, comprising PMOS transistors PI, P2, NMOS transistors N1, N2 and inverters I17. In other words, the high voltage detector shown in FIG. 5 is constructed with differential amplifiers.

The operation of the circuit shown in FIG. 5 is now described.

First of all, the reference voltage Vref input to the high voltage detector is set to be a level of high voltage, higher than the high level thereof. For example, if low, high and high voltage levels of voltage are respectively set at OV, 3V and 6V, the reference voltage Vref inputted from the high voltage detector should be set at a value such as 4V or 5V. Under the assumption that all those levels of voltage are set as such, operations of the high voltage detector will be described below.

If the voltage of the signal Ai transmitted to an input pin is a low level thereof, the NMOS transistor NI turns off and the NMOS transistor N2 turns on to thereby turn on the PMOS transistors P1, P2. Therefore, a voltage of high level is set at the drain of the PMOS transistor P1. The inverter I17 inverts a high level of voltage to generate a low level of output voltage SAi.

Also, if the voltage of the signal Ai inputted to an input pin is a high level thereof, the NMOS transistor N1 turns off and the NMOS transistor N2 turns on to generate a low level of output voltage SAi.

If the voltage of the signal Ai inputted to an input pin is a high voltage level thereon, the NMOS transistor NI turns on and the NMOS transistor N2 turns off to thereby set a low level of voltage at the drain of the PMOS transistor PI. Then, the inverter 17 inverts a low level of voltage to generate a high level of output voltage SAi.

That is, the high voltage detector shown in FIG. 5 generates a high level of output voltage SAi if a-high voltage level of voltage is applied through the input pin Ai, and a low level of output voltage SAi if a high or low level of voltage is applied through the input pin Ai.

Figure 6:
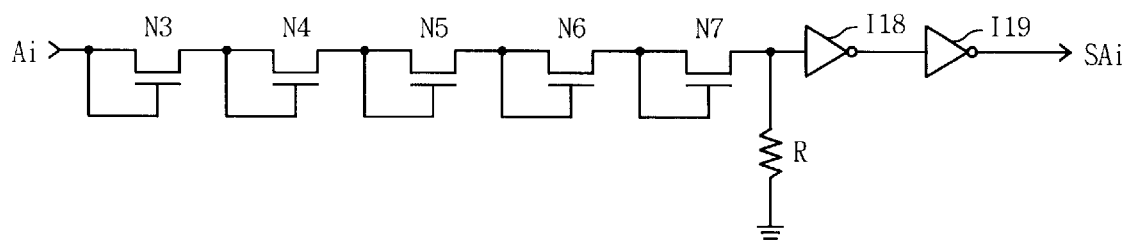
FIG. 6 is a circuit diagram for illustrating a high voltage detector in accordance with another embodiment of the present invention.

FIG. 6 is a circuit diagram of a high voltage detector in accordance with another embodiment of the present invention. Generally, the circuit includes a voltage dropping circuit, such as that made of a series of diodes. It also includes a buffer for buffering and outputting the reduced signal from the voltage level dropping circuits. In this embodiment, the diodes are made from NMOS transistors N3, N4, . . . , N7, and the buffer is made from inverters 118, 119 and a resistance R.

The operation of the high voltage detector shown in FIG. 6 is now described.

Under the assumptions that low (OL), high (OH), and high voltage (SH) levels of the signal Ai transmitted to the input pin are respectively set at OV, 3V and 6V, and that the turned-on resistance of the NMOS transistors N3, N4, . . . , N7 connected in series is much lower than the resistance R, operations of the high voltage detector shown in FIG. 6 at the test operational mode will be described below. First of all, if voltage of the signal Ai transmitted to the input pin is OV or 3V, a low level of a signal is outputted through the NMOS transistors N3, N4, . . . , N7. The inverters 118, 119 buffer a low level of the signal, to generate a low voltage detecting signal SAi.

On the other hand, if a high voltage level of the signal Ai is transmitted, the NMOS transistors N3, N4, . . . , N7 connected in series act as diodes. In other words, they turn on, to output a high level of the signal through the resistance R. The diodes are such in number so as to convert ash level to an OH level signal. Inverters I18, I19 buffer a high level of the signal, to generate a high level of the high voltage detecting signal SAi.

Therefore, it can be concluded that the high voltage detectors shown in FIGS. 5 and 6 perform the same operations.

The truth table of the circuit shown in FIG. 4 is shown in the table of FIG. 7. In that table, I, H and SH respectively symbolize low, high, high voltage levels of voltage. A2 and A3 symbolize signals respectively transmitted to input pins 34-1, 34-2; PA3B and PA3 output signals outputted from the buffer 36-2; SAI an output signal outputted from the high voltage detector 38-1; SA2 an output signal outputted from the high voltage detector 38-2; PPA2 an output signal outputted from the scrambling circuit 40-1, PPA3 an output signal outputted from the scrambling circuit 40-2; and d1, d2, d3, d4, d5, d6, d7, d8, and d9 output signals outputted from the decoder 44.

By using the table of FIG. 7, the operations to generate the mode selecting signals M1, M2, M3, M4, M5, M6, M7, M8, M9 will be described in accordance with the 5 semiconductor device of the present invention below.

In the table of FIG. 7, if all the levels of the input signals A2, A3 are L level thereof, the output signals PA2B, PA2, SAI outputted from the buffer 36-1 and the high voltage detector 38-1 are respectively set at H, L, L levels thereof, and the output signals PA3B, PA3, SA2 are respectively set at H, L, L levels thereof. Furthermore, the output signals (PA2B, PPA2), (PA3B, PPA3, SA2) are respectively set at H, L, L levels thereof. Therefore, the output signals d1, d2, . . . , d9 of the decoder 44 are set at H, L, . . . L level thereof. The mode selecting circuit 46 responds to the mode setting signal MRS being high, to turn the output signals outputted from the decoder 44 into mode selecting signals MI, M2, . . . , M9 and output them.

In addition, in the table of FIG. 7, if levels of the input signals A2, A3 are respectively set at SH, H, the output signals PA2B, PA2, SA1 outputted from the buffer 36-1 and a high voltage detector 38-1 are respectively L, H, H levels thereof, and the output signals PA3B, PA3, SA2 are respectively set at L, H, L. Furthermore, the output signals (PA2B, PPA2, SA1), (PA3B, PPA3, SA2) outputted from the scrambling circuits 40-1, 402 are respectively 20 set at L, L, H levels thereof and L, H, L levels thereof. Therefore, the output signals d1, d2, d9 of the decoder 44 are respectively set at L, L, . . . , L, H, L level thereof. The mode selecting circuit 46 responds to the mode setting signal MRS being high, to turn the output signals outputted from the decoder 44 into mode selecting signals MI, M2, . . . , M9 and output them.

In other words, the semiconductor device of the present invention shown in FIG. 4 internally generates 9 different mode selecting signals, if input signals of three levels are transmitted to two input pins. If three levels of input signals are transmitted to three input pins, 27 different mode selecting signals can be internally generated.

Therefore, if the number of test items increases at the test operational mode, a variety 30 of mode selecting signals can be generated by a small number of pins.

Furthermore, it becomes possible to generate output signals PA2B, PA2, PA3B, . . . , PAnB, PAn from the buffers 56-1, 56-2, . . . , 56-n and output signals PA2, PPA2, PSAI, SBI, PAnB, PPAn, PSA(n-I), SB(n-l) from the scrambling circuits 62-1, 62-2, . . . , 62-n at the normal operational mode. That is, at the normal operational mode, the output signals of the buffers are generated into addresses or data if input signals of two or three levels are transmitted to pins.

Figure 8:
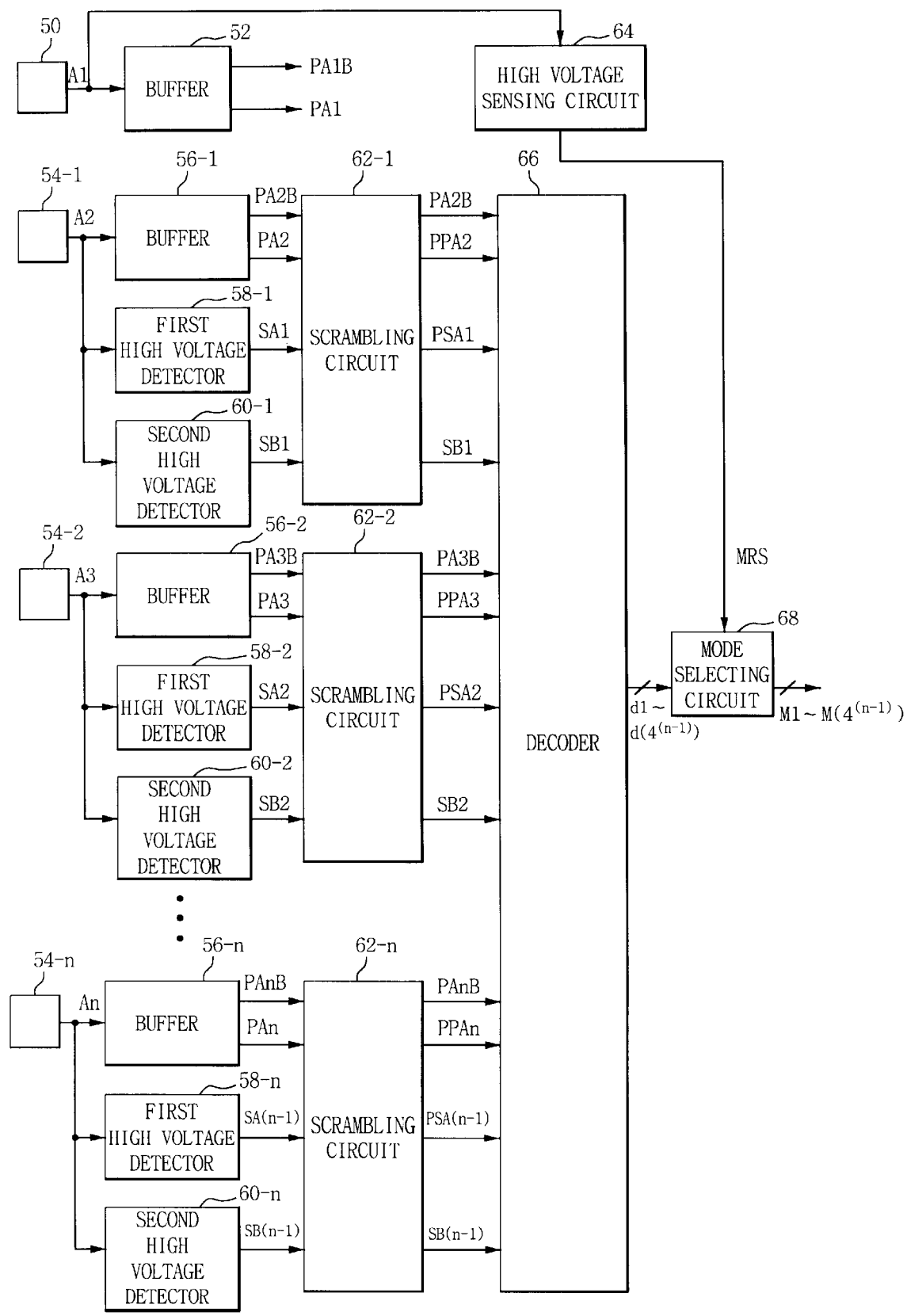
FIG. 8 is a block diagram for illustrating a signal generating circuit of a semiconductor device in accordance with another embodiment of the present invention, wherein each input test pin can receive up to four input values.

FIG. 8 is a block diagram of a signal generating circuit in accordance with another embodiment of the present invention. The circuit includes input pins 50, 54-1, 54-2, . . . , 54-n, buffers 52, 56-1, 56-2, . . . , 56-n, first high voltage detectors 58-1, 58-2, . . . , 58-n, second high voltage detectors 60-1, 60-2, . . . , 60-n, scrambling circuits 62-1, 62-2, . . . , 62-n, a high sensing circuit 64 and a mode selecting circuit 68.

In FIG. 8, the input pin 50 is used as a pin for transmitting a-signal to select a test or normal operational mode, and the input pins 54-1, 54-2, . . . , 54-n are used as pins for transmitting mode selecting signals to select test items at the test operational mode. Furthermore, the buffers 52, 56-1, 56-2, . . . , 56-n respectively buffer the input signals, to generate mutually complementary levels of two signals PAi, PAIB (i=1, 2, . . . n).

The first high voltage detectors 58-1, 58-2, . . . , 58-n respectively compare the input signals and the reference voltage thereof At this time, if a level of voltage higher than the reference voltage is applied, the first high voltage detectors generate signals SAi (i=1, 2, . . . , n-l).

The second high voltage detectors 60-1, 60-2, . . . , 60-n in general output a higher second level signal indicative of whether the input signal has a second extra high voltage level, which is higher than the first extra high voltage level of the first high voltage detectors. In particular, they respectively compare the input signals and the reference voltage thereof. At this time, if a level of voltage higher than the reference voltage is applied, the second high voltage detectors generate signals SBi (i=l, 2, . . . , n-i).

The scrambling circuits 62-1, 52-2, . . . , 62-n respectively scramble input signals PAiB, PAi, SAj, SBj (i=2, 3, . . . , n) (=1, 2, . . . , n-i), to generate signals PAiB, PPAi, PSAj, SBj (i=2,3, . . . , n) (=1,2, . . . , n-I). The high voltage sensing circuit 64 senses the high voltage inputted from the input pin 50, to generate a signal of a high level-at the test operational mode, and a low level at the normal operational mode, respectively.

The decoder 66 decodes the output signals outputted from the scrambling circuits 621, 62-2, . . . , 62-n to generate mode selecting signals dX.

The mode selecting circuit 68 responds to a high level of the signal MRS to select and latch the mode selecting signals outputted from the decoder 66. The mode selecting signals generated as such make the internal state of the semiconductor device set up for testing specifically designated test items at the test operational mode.

In the case of the semiconductor device shown in FIG. 8, signals of four levels can be inputted from the tester at the test operational mode, and signals of two, three or four levels can be inputted from an external system out of the semiconductor device at the normal operational mode.

Figure 9:
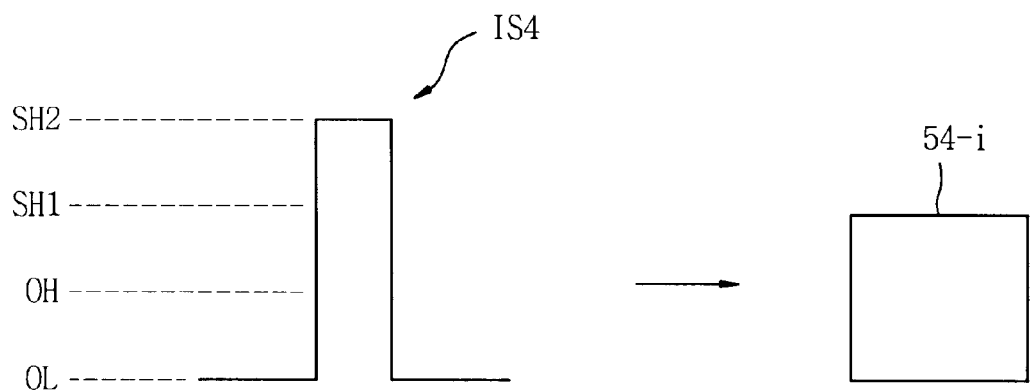
FIG. 9 is a signal of 4 possible levels being applied to an input test terminal of the device of FIG. 8.

The various levels are now explained in more detail with reference to FIG. 9. On the input test pins 54-i there is applied an input signal IS4. Generally, input signal IS4 has one of 4 preselected levels, namely an ordinary low (OL), an ordinary high (OH), a first high (SHi), also known as a first extra high (SH1), and a second high (SH2), also known as a second extra high (SH2). As in the previous case, other names are also applicable. What is important is that different levels can convey different information. Moreover, additional levels, such as a third extra high voltage, can be defined for the system.

In other words, low, high, first high voltage or second high voltage levels of signals can be inputted at the test operational mode, and signals of low or high level or low, high, first high voltage or second high voltage levels can be inputted at the normal operational mode.

If four levels of signals can be inputted to address input pins at the normal operational mode, the number of address input pins can be significantly reduced.

Figure 10:
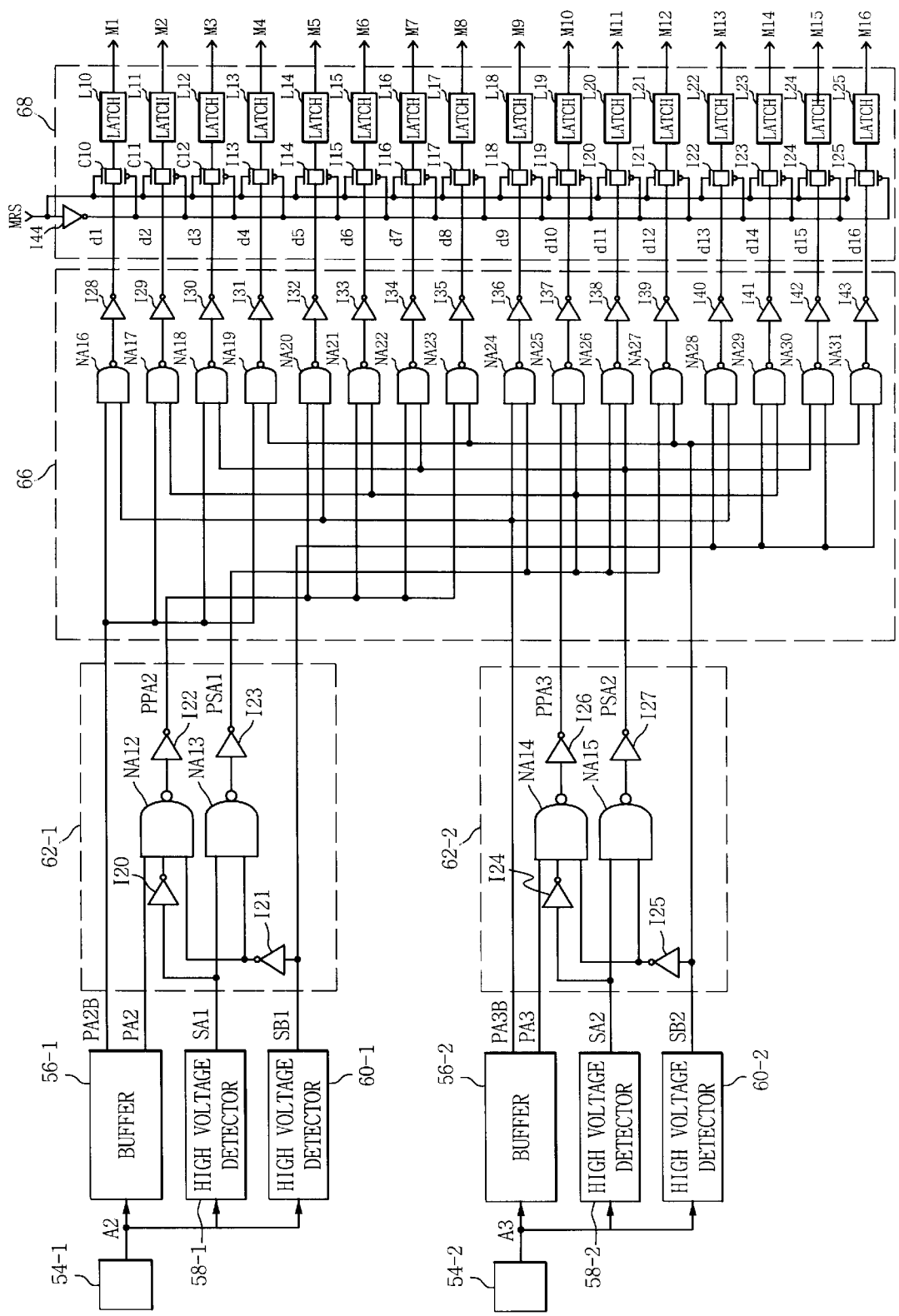
FIG. 10 is a circuit diagram for implementing a portion of the block diagram of FIG. 8.

FIG. 10 is a circuit diagram for illustrating the structure of another embodiment of the block diagram shown in FIG. 8, wherein input signals of four levels are respectively transmitted to two input pins, to generate 16 mode selecting signals M1, M2, . . . , M16.

The high voltage detectors 58-1, 60-1 can be made by separate circuits, similar to those taught with reference to the 3 level signal. If the high voltage detector shown in FIG. 5 is applied to the first and second high voltage detectors of FIG. 10, the level of the reference voltage Vrefl of the first high voltage detectors 58-1, 58-2 should be set at a level of voltage that is between the high level thereof and the first high voltage level thereof. The level of the reference voltage Vref2 of the second high voltage detectors 60-1, 60-2 should be set at a level of voltage, higher than the first high voltage level thereof.

The scrambling circuit 62-1 is constructed with inverters I20, I21, I22, I23 and NAND gates NA12, NA13, and the scrambling circuit 62-2 is constructed with inverters I24, I25, I26, I27 and NAND gates NA14, NA15. The scrambling circuit 62-1 in this case can be considered to have produced two control signals, etc.

Additionally, the decoder 66 is constructed with NAND gates NA16, NA17, . . . , NA31 and inverters I28, I29, . . . , I43.

The mode selecting circuit 68 is constructed with CMOS transmission gates C10, C11, . . . , C25, latches L10, L11, . . . , L25 and an inverter 144.

Functions of the parts in the circuit thus constructed and shown in FIG. 10 will be described below.

The buffers 56-1, 56-2 respectively buffer the signals inputted from the input pin 54 1, 54-2 to generate complementary output signals (PA2B, PA2), (PA3B, PA3). The high voltage detectors 58-1, 58-2 respectively detect and buffer the first high voltage inputted from the input pins 54-1, 54-2 to generate a high level of signals SA1, SA2. The high voltage detectors 60-1, 60-2 respectively detect and buffer the second high voltage inputted from the input pins 54-1, 54-2 to generate a high level of signals SB1, SB2. The scrambling circuit 62-1 outputs signals PA2B, SB1 as they are, inverts signals SA1, SB1 through the inverters I20, I21 and ANDs a signal PA2 and signals inverted through the inverters I20, I21 through the NAND gate NA12 and the inverter 122, to generate a signal PPA2 and ANDs a signal SA1 and a signal inverted through the inverter I21 to generate a signal PSAL. In addition, the scrambling circuit 62-2 performs the same operations as the scrambling circuit 62-1 to generate signals PA3B, PPA3, PSA2, SB2.

The decoder 66 ANDs the output signals PA2B, PA2, SA1, SB1 outputted from the scrambling circuit 62-1 and the output signals PA3B, PA3, SA2, SB2 outputted from the scrambling circuit 62-2 through NAND gates NA16, NA17, . . . , NA31 and inverters 128,129, 143 to generate decoded signals d1, d2, . . . , d16.

The mode selecting circuit 68 responds to a high level of a mode setting signal MRS to respectively transit the output signals d1, d2, . . . , d16 outputted from the decoder 66 through CMOS transmission gates C10, C11, . . . , C25, and the latches L10, L11, . . . , L25 respectively latch the output signals outputted from the CMOS transmission gates C10, C11, . . . , C25 to thereby output mode selecting signals M1, M2, . . . , M16.

The truth table of the circuit of FIG. 10 is shown in a table of FIG. 11. In that table, L, H. SH1 and SH2 respectively symbolize low, high, the first high voltage and the second high voltage levels of voltage. A2 and A3 symbolize signals respectively transmitted to input pins 54-1, 54-2; PA3B and PA2 output signals outputted from the buffer 56-1; PA3B, PA3 output signals outputted from the buffer 56-2; SA1 an output signal outputted from the high voltage detector 58-1; SA2 an output signal outputted from the high voltage detector 58-2; SB1 an output signal outputted from the high voltage detector 60-1; SB2 an output signal outputted from the high voltage detector 60-2; PPA2 and PSAI output signals outputted from the scrambling circuit 62-1; PPA3 and PSA 2 output signals outputted from the scrambling circuit 62-2; and d1, d2, . . . and d16 output signals outputted from the decoder 66.

By using the table of FIG. 11, the operations to generate mode selecting signals M1, M2, M3, M4, M5, M6, M7, M8, M16 will be described in accordance with the semiconductor device of the present invention below.

In the table of FIG. 11, if all the level of the input signals A2, A3 is set at L level thereof, the output signals PA2B, PA2, SA1, SB1 outputted from the buffer 56-1 and the high voltage detectors 58-1, 60-1 are respectively set at H, L, L, L levels thereof, and the output signals PA3B, PA3, SA2, SB2 outputted from the buffer 56-1 and the high voltage detectors 58-2, 60-2 are respectively set at H, L, L, L levels thereof Furthermore, the output signals (PA2B, PPA2, PSA1, SB1), (PA3B, PPA3, PSA2, SB2) are respectively set at H, L, L, L levels thereof Therefore, the output signals d1, d2, . . . , d16 outputted from the decoder 66 are respectively set at H, L, . . . L levels thereof The mode selecting circuit 68 responds to the mode setting signal MRS to turn the output signals outputted from the decoder 66 into mode selecting signals M1, M2, . . . , M16 and output them.

In addition, in the table of FIG. 11, if the input signals A2, A3 are respectively set at SH2, H levels thereof, the output signals PA2B, PA2, SA1, SB1 of the buffer 56-1 and high voltage detectors 58-1, 60-1 are respectively set at L, H, H, H levels thereof, and the output signals PA3B, PA3, SA2, SB2 of the buffer 56-2 and the high voltage detectors 58-2, 60-2 are respectively set at L, H, L, L levels thereof. Furthermore, the output signals (PA2B, PPA2, PSA1, SB1) (PA3B, PPA3, PSA2, SB2) of the scrambling circuits 62-1, 62-2 are respectively set at L, L, L, H levels thereof and L, H, L, L levels thereof Therefore, the output signals d1, d2, . . . , d16 of the decoder 66 are respectively set at L,.L, . . . , L, H, L, L levels thereof The mode selecting circuit 68 responds to the mode setting signal MRS to output mode selecting signals M1, M2, . . . , M16.

In other words, the signal generating circuit of the semiconductor device of the present invention shown in FIG. 10 internally generates 16 mode selecting signals if input signals at four levels are transmitted to two input pins. If input signals of four levels are transmitted to three input pins, 64 mode selecting signals can be internally generated.

Therefore, it becomes possible to generate output signals PA2B, PA2, PA3B, PA3, . . . , PAnB, PAn of the buffers 56-1, 56-2, . . . , 56-n and output signals PA2B, PPA2, PSA1, SB1, PANB, PPAn, PSA(n-1), SB(n-1) of the scrambling circuits 62-1, 62-2, . . . , 62-n at the normal operational mode.

That is, at the normal operational mode, output signals of the buffers are generated into addresses or data if input signals of two levels are transmitted the pins, and the output signals of the scrambling circuits are generated into addresses or data if input signals of three levels are transmitted to the pins.

Therefore, in the signal generating circuit of the semiconductor device of the present invention, n pins are used as the pins for generating test mode selecting signals, and, if the number of levels of the signals inputted into n pins is M, the number of mode selecting signals to be generated can be $M^n$.

Thus, if the number of test items to be tested at the test operational mode increases, a small number of pins can generate a variety of mode selecting signals.

Most of the aforementioned description has been made in terms of the test operational mode. However, the semiconductor device of the present invention is a memory device, which can be applied to a system. If the mode setting circuit of the present invention is constructed at address input pins, and if the address to be inputted from outside has signals of four levels, a small number of pins can be used for generating a great number of address decoding signals. Therefore, it becomes possible to overcome the problem that the number of pins is restricted in spite of reduction in the size of a chip.

Therefore, the signal generating circuit of the semiconductor device of the present invention generates and transits more than three levels of signals from a tester to input pins at a test operational mode, thereby enabling to test a larger variety of test items than the prior art.

Furthermore, if more than three levels of signals are transmitted from an external device at the normal operational mode, a small number of pins can internally generate a great number of signals, thereby overcoming the limitation that the number of pins should be increased against the tendency of reducing the size of a chip.

Figure 12:
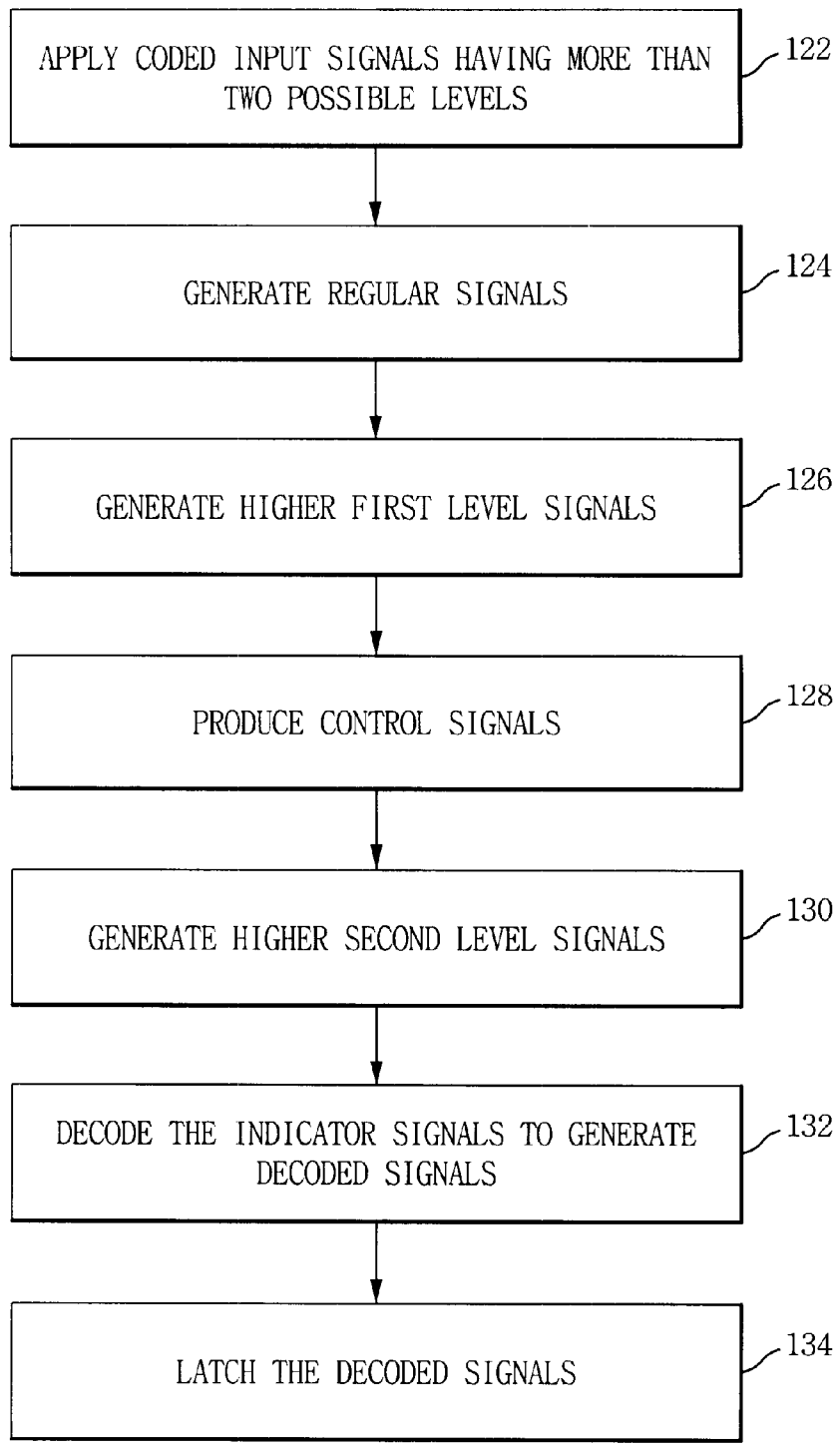
FIG. 12 is a flowchart illustrating a method of the invention.

The method of the invention is now described in more detail with reference to FIG. 12. The method is for invoking a test mode in a circuit of a semiconductor device.

According to box 122, coded input signals are applied to input test terminals of the circuit. At least one of the input signals has more than two possible levels.

Then indicator signals are generated in response to the coded input signals. The indicator signals being of only two levels. This is accomplished by a number of ways. The preferred way is shown in FIG. 12.

According to box 124, regular signals are generated if a coded input signal has a preset ordinary low level.

According to box 126, higher first level signals are generated if the input signal has a first extra high level that is preset to be higher than the ordinary low level.

According to box 128, control signals are produced in response to the regular signals and to the higher first level signals. The control signals are produced if the input signal has an ordinary high level that is preset to be higher than the ordinary low level and lower than the first extra high level.

The above description works well if the input signals have three possible levels. If they have more levels, then more signals are produced. For example, according to box 130, higher second level signals are generated if the input signal has a second extra high voltage level that is preset to be higher than the first extra high voltage level. Then the control signal is produced in response also to the higher second level signal. According to a next box 132, the indicator signals are decoded to generate decoded signals. According to a next box 134, the decoded signals are optionally latched. The remaining portion of the method becomes apparent from the remainder of this description.

While the signal generating circuit of the semiconductor device of the present invention has been described in terms of preferred embodiments, those skilled in the art will recognize that the invention is not limited at those embodiments, and can be practiced with modification within the spirit and scope of the appended claims.

In the claims

1. A signal generating circuit of a semiconductor device comprising:
    an input test pin for receiving an input signal;
    a buffer for outputting a regular signal indicative of whether the input signal has an ordinary low level;
    a first higher level voltage detector for outputting a higher first level signal indicative of whether the input signal has a first extra high level higher than the ordinary low level; and
    a scrambling circuit for producing, in response to the regular signal and to the higher first level signal, a control signal indicative of whether the input signal has an ordinary high level higher than the ordinary low level and lower than the first extra high level, the scrambling circuit including:
    an inverter for inverting the higher first level signal; and
    a NAND gate for NANDing a complement of the regular signal with the inverted higher first level signal, to produce the control signal.

2. The signal generating circuit of claim 1, wherein the first higher voltage detector includes differential comparators for comparing the input signal and a preset reference voltage having a level between the ordinary high level and the first extra high level.

3. The signal generating circuit of claim 1, wherein the first higher voltage detector includes
    a voltage level dropping circuit for reducing the input signal to a preset level; and
    a buffer for buffering and outputting a reduced signal from the voltage level dropping circuit.

4. The signal generating circuit of claim 1, further comprising:
    a second higher level voltage detector for outputting a higher second level signal indicative of whether the input signal has a second extra high voltage level that is higher than the first extra high voltage level, and
    wherein the scrambling circuit produces the control signal in response also to the higher second level signal.

5. The signal generating circuit of claim 4, wherein the second higher voltage detector includes differential comparators for comparing the input signal and a preset reference voltage having a level between the ordinary high level and the first extra high level.

6. The signal generating circuit of claim 5, wherein the second higher voltage detector includes
    a voltage level dropping circuit for reducing the input signal to a preset level; and
    a buffer for buffering and outputting the reduced signal from the voltage level dropping circuit.

7. The signal generating circuit of claim 4, wherein the scrambling circuit includes:
    a first inverter for inverting the higher first level signal;
    a second inverter for inverting the higher second level signal; and
    a NAND gate for NANDing an inverse of the regular signal with a complement of a first level signal to produce the control signal.

8. A signal generating circuit of a semiconductor device comprising:
    n input test pins for receiving respective coded input signals, where n is an integer larger than one, and at least one of the input signals is coded in more than two possible levels;
    n indicator signal generators, each coupled respectively with an associated input test pin, each indicator signal generator for generating indicator signals in response to the coded input signal received by its associated input test pin, the indicator signals being of only two levels, wherein at least one of the indicator signal generators comprises:
    a buffer for outputting a regular signal indicative of whether the associated input signal has an ordinary low level;
    a first higher level voltage detector for outputting a higher first level signal indicative of whether the associated input signal has a first extra high level higher than the ordinary low level; and
    a scrambling circuit for producing, in response to the regular signal and to the higher first level signal, a control signal indicative of whether the associated input signal has an ordinary high level higher than the ordinary low level and lower than the first extra high level and includes:
    an inverter for inverting the higher first level signal: and
    a NAND gate for NANDing a complement of the regular signal with the inverted higher first level signal, to produce the control signal:
    a decoder for receiving the indicator signals to produce decoded signals; and
    a mode selecting circuit for generating mode selecting signals with the decoded signals responsive to mode setting signals.

9. The signal generating circuit of claim 8, wherein the first higher voltage detector includes differential comparators for comparing the input signal and a preset reference voltage having a level between the ordinary high level and the first extra high level.

10. The signal generating circuit of claim 8, wherein the first higher voltage detector includes
   a voltage level dropping circuit for reducing the input signal to a preset level; and
   a buffer for buffering and outputting the reduced signal from the having a voltage level dropping circuit.

11. The signal generating circuit of claim 8, wherein the indicator signal generator further comprises:
   a second higher level voltage detector for outputting a higher second level signal indicative of whether the associated input signal has a second extra high level higher than the first extra high level,
   wherein the scrambling circuit produces the control signal in response also to the corresponding higher second level signal.

12. The signal generating circuit of claim 11, wherein the second higher voltage detector includes differential comparators for comparing the input signal and a preset reference voltage having a level between the second extra high level and the first extra high level.

13. The signal generating circuit of claim 11, wherein the second higher voltage detector includes
   a voltage level dropping circuit for reducing the input signal to a preset level; and
   a buffer for buffering and outputting the reduced signal from the having a voltage level dropping circuit.

14. A method of invoking a test mode in a circuit of a semiconductor device, the method comprising:
   applying coded input signals to input test terminals of the circuit, at least one of the input signals having more than two possible levels;
   generating indicator signals in response to the coded input signals, the indicator signals being of only two levels, generating indicator signals further comprising: generating a regular signal if a coded input signal has an ordinary low level; generating a higher first level signal if the input signal has a first extra high level higher than the ordinary low level; and producing, in response to the regular signal and to the higher first level signal, a control signal if the input signal has an ordinary high level higher than the ordinary low level and lower than the first extra high level; and
   generating a higher second level signal if the input signal has a second extra high voltage level that is higher than the first extra high voltage level, wherein the control signal is produced in response also to the higher second level signal; and
   decoding the indicator signals to generate decoded signals.

* * * * *

UNITED STATES PATENT AND TRADEMARK OFFICE
CERTIFICATE OF CORRECTION

PATENT NO. : 6,658,612 B1
DATED : December 2, 2003
INVENTOR(S) : Park et al.

It is certified that error appears in the above-identified patent and that said Letters Patent is hereby corrected as shown below:

Title page,
Item [57], ABSTRACT,
Line 5, "includes an indicator I/O signal" should read -- includes n indicator signal --.

Column 1,
Line 34, "generate $n^2$ test" should read -- generate $2^n$ test --.
Line 41, "is 2, where" should read -- is $2^n$, where --.

Column 2,
Line 26, "includes an indicator" should read -- includes n indicator --.

Column 3,
Line 55, "signal SAI indicative" should read -- signal SA1 indicative --.
Line 64, "signals PAIB, PPAi," should read -- signals PAiB, PPAi, --.
Line 65, "2, … , n-I). The" should read -- 2, … , n-1). The --.

Column 4,
Line 10, "circuits 401, 40-2," should read -- circuits 40-1, 40-2, --.
Line 37, "levels. In other" should read -- levels.  In other --.
Line 51, "NAND gate 10 NA1," should read -- NAND gate NA1, --.
Line 52, "circuit 4-2 is" should read -- circuit 40-2 is --.
Line 52, "inverters 14, 15, 16 and" should read -- inverters I4, I5, I6 and --.
Line 55, "inverters 17, 18," should read -- inverters I7, I8, --.
Line 57, "C2, is …, C9," should read -- C2, …, C9, --.
Line 64, "high 20 voltage" should read -- high voltage --.

Column 5,
Line 2, "inverters 11, 12 and" should read -- inverters I1, I2 and --.
Line 3, "inverters 11, 12 and" should read -- inverters I1, I2, and --.
Line 4, "gate NAI and" should read -- gate NA1 and --.
Line 5, inverter 13 to" should read -- inverter I3 to --.
Line 9, "inverter 17 to" should read -- inverter I7 to --.
Line 11, "inverter 18 to" should read -- inverter I8 to --.
Line 12, "a 30 NAND gate" should read -- a NAND gate --.
Line 13, "inverter 19 to" should read -- inverter I9 to --.
Line 14, "inverter 110 to" should read -- inverter I10 to --.
Line 16, "inverter 111 to" should read -- inverter I11 to --.
Line 18, "inverter 112 to" should read -- inverter I12 to --.
Line 19, "inverter 113 to" should read -- inverter I13 to --.

UNITED STATES PATENT AND TRADEMARK OFFICE
CERTIFICATE OF CORRECTION

PATENT NO. : 6,658,612 B1
DATED : December 2, 2003
INVENTOR(S) : Park et al.

It is certified that error appears in the above-identified patent and that said Letters Patent is hereby corrected as shown below:

Column 5 (cont'd),
Line 20, "SA1 PPA3" should read -- SA1, PPA3 --.
Line 21, "gate NA1 and " should read -- gate NA10 and --.
Line 21, "inverter 114 to" should read -- inverter I14 to --.
Line 23, "inverter 15 to" should read -- inverter I15 to --.
Line 25, "respectively trait output" should read -- respectively transmit output --.
Line 28, "latches L1 L2," should read -- latches L1, L2, --.
Line 33, "transistors PI, P2," should ead -- transistors P1, P2, --.
Line 50, "transistor NI turns" should read -- transistor N1 turns --.
Line 61, "level thereon, the" should read -- level thereof, the --.
Line 63, "transistor PI. Then," should read -- transistor P1. Then, --.
Line 64, "inverter 17 inverts" should read -- inverter I17 inverts --.
Line 67, "if a-high voltage" should read -- if a high voltage --.

Column 6,
Line 11, "inverters 118, 119 and" should read -- inverters I18, I19 and--.
Line 21, "below. First of " should read -- below. First of --.
Line 24, " inverters 118, 119 buffer" should read -- inventers I18, I19 buffer --.
Line 32, "to convert ash level" should read -- to convert a SH level --.
Line 40, "table, I, H and" should read -- table, L, H and --.
Line 44, "36-2; SAI an" should read -- 36-2; SA1 an --.
Line 53, "with the 5 semiconductor" should read -- with the semiconductor --.
Line 56, "PA2, SAI outputted" should read -- PA2, SA1 outputted --.
Line 67, "signals MI, M2," should read -- signals M1, M2, --.

Column 7,
Line 8, "40-1, 402 are" should read -- 40-1, 40-2 are --.
Line 8, "respectively 20 set" should read -- respectively set --.
Line 10, "d2, d9 of" should read -- d2,...,d9 of --.
Line 14, "signals MI, M2," should read -- signals M1, M2, --.
Line 23, "variety 30 of mode" should read -- variety of mode --.
Line 27, "PS AI, SBI, PAnB," should read -- PSA1, SB1,...,PAnB, --.
Line 28, "PSA(n-I), SB(n-1)" should read -- PSA(n-1), SB(n-1) --.
Line 42, "a-signal to" should read -- a signal to --.
Line 49, "PAIB(i=1,2,...n)." should read -- PAiB(i=1,2,...n). --.
Line 52, "thereof At this" should read -- thereof. At this --.
Line 63, "(i=1,2,..., n-i)." should read -- (i=1,2,..., n-1). --.
Line 66, "(=1 ,2,..., n-i)," should read -- (=1,2,..., n-1), --.
Line 67, "(=1 ,2,..., n-I)." should read -- (=1,2,..., n-1). --.

UNITED STATES PATENT AND TRADEMARK OFFICE
CERTIFICATE OF CORRECTION

PATENT NO.   : 6,658,612 B1
DATED        : December 2, 2003
INVENTOR(S)  : Park et al.

It is certified that error appears in the above-identified patent and that said Letters Patent is hereby corrected as shown below:

Column 8,
Line 2, "level-at the" should read -- level at the --.
Line 6, "circuits 621, 62-2," should read -- circuits 62-1, 62-2, --.
Line 24, "high (Shi), also" should read -- high (SH1), also --.
Line 67, "inverter 144." should read -- inverter I44. --.

Column 9,
Line 4, "pin 541, 54-2 to" should read -- pin 54-1, 54-2 to --.
Line 16, "inverter 122, to" should read -- inverter I22, to --.
Line 18, "signal PSAL. In" should read -- signal PSA1. In --.
Line 25, "inverters 128, 129, 143 to" should read -- inverters I28, I29, I43 to --.
Line 37, "L, H. SH1 and" should read -- L, H, SH1 and --.
Line 46, "and PSAI output" should read -- and PSA1 output --.
Line 63, "thereof Furthermore," should read -- thereof. Furthermore, --.
Line 65, "thereof Therefore," should read -- thereof. Therefore, --.
Line 67, "thereof The" should read -- thereof. The --.

Column 10,
Line 13, "thereof Therefore," should read -- thereof. Therefore, --.
Line 15, "L,.L,…,L," should read -- L, L,…,L, --.
Line 15, "thereof The" should read -- thereof. The --.
Line 27, PANB, PPAn," should read -- PAnB, PPAn, --.
Line 31, "transmitted the pins," should read -- transmitted to the pins, --.
Line 55, "and transits more" should read -- and transmits more --.

Column 11,
Line 25, "signal. According" should read -- signal. ¶ According --.

Column 12,
Line 14, "of claim 5, wherein" should read -- of claim 4, wherein --.
Line 56, "signal: and" should read -- signal; and --.

UNITED STATES PATENT AND TRADEMARK OFFICE
CERTIFICATE OF CORRECTION

PATENT NO.   : 6,658,612 B1
DATED        : December 2, 2003
INVENTOR(S)  : Park et al.

It is certified that error appears in the above-identified patent and that said Letters Patent is hereby corrected as shown below:

<u>Column 12 (cont'd)</u>,
Line 59, "signal: a" should read -- signal; a --.

Signed and Sealed this

Seventeenth Day of August, 2004

JON W. DUDAS
*Acting Director of the United States Patent and Trademark Office*